United States Patent [19]
> Dingwall

[11] 4,132,998
[45] Jan. 2, 1979

[54] INSULATED GATE FIELD EFFECT TRANSISTOR HAVING A DEEP CHANNEL PORTION MORE HIGHLY DOPED THAN THE SUBSTRATE

[75] Inventor: Andrew G. F. Dingwall, Bridgewater, N.J.

[73] Assignee: RCA Corp., New York, N.Y.

[21] Appl. No.: 828,849

[22] Filed: Aug. 29, 1977

[51] Int. Cl.² .......................................... H01L 29/78
[52] U.S. Cl. ...................................... 357/23; 357/13; 357/52; 357/90; 357/91
[58] Field of Search ...................... 357/13, 23, 52, 90, 357/91

[56] References Cited

U.S. PATENT DOCUMENTS

| | | | |
|---|---|---|---|
| 3,283,221 | 11/1966 | Heiman | 357/23 |
| 3,600,647 | 8/1971 | Gray | 357/23 |
| 3,631,310 | 12/1971 | Das | 357/23 |
| 3,814,992 | 6/1974 | Kump et al. | 357/23 |
| 3,891,468 | 6/1975 | Ito et al. | 357/23 |
| 4,007,478 | 2/1977 | Yagi | 357/23 |
| 4,021,835 | 5/1977 | Etoh et al. | 357/23 |
| 4,047,974 | 9/1977 | Harari | 357/23 |
| 4,074,301 | 2/1978 | Paivinen et al. | 357/23 |

OTHER PUBLICATIONS

J. Hanson et al., "An N–Channel MOSFET . . . Device Doping," I.E.D.M. Meeting Proc., 1974, pp. 373–385.
J. Verjans et al., "Electrical Char. . . . Logic Ckts.," I.E.D.M. Meeting Proc., 1974, pp. 386–389.
T. Masuhara et al., "Control and Design of MOSFET Low–Level Currents by Ion–Implantation," I.E.D.M. Meeting Proc., 1974, pp. 397–399.

Primary Examiner—Joseph E. Clawson, Jr.
Attorney, Agent, or Firm—H. Christoffersen; R. P. Williams; Sanford J. Asman

[57] ABSTRACT

The source and drain of an N-MOSFET can be brought closer together without substantially increasing capacitance and punch-through effects, by using a very high resistivity P-substrate, a moderately high resistivity P-type region in the channel zone and a thin but low resistivity surface-adjacent channel portion through which current flows. The P- type region and the surface-adjacent channel portion are ion-implantations. The P- type region extends deep enough into the substrate to shield the source from electrostatic coupling with the drain. Diffused, low reactance integrated circuit resistors can be made using the same principles.

8 Claims, 1 Drawing Figure

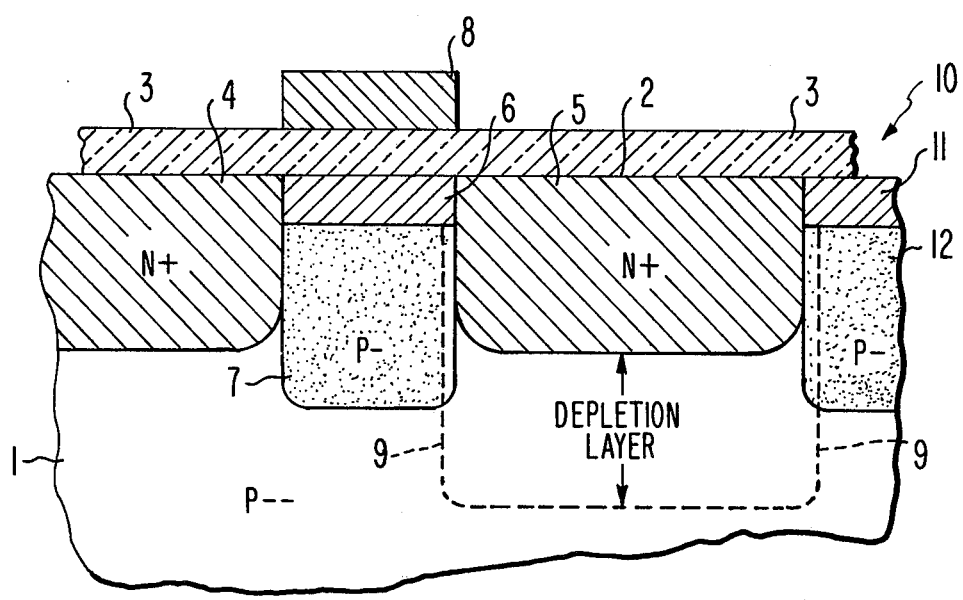

INSULATED GATE FIELD EFFECT TRANSISTOR HAVING A DEEP CHANNEL PORTION MORE HIGHLY DOPED THAN THE SUBSTRATE

The present invention relates to a semiconductor body portion having separated electrode regions produced at a surface thereof, and a conditionally conductive channel connecting the electrode regions near the surface. Such semiconductor body portions are known in N or P type metal oxide semiconductor devices, (NMOS or PMOS devices) in discrete or integrated form and also in integrated circuit resistors. The MOS devices may be of the well-known depletion or enhancement types, the difference residing essentially in the relative bias or electrostatic field conditions under which the channel conducts or just begins to conduct (threshold condition).

It is known in such devices to have doped channel portions between the terminals. For example, multiple ion implantations which are of differing conductivities, or of differing conductivity types from each other, have been proposed. Several papers from the IEEE 1974 Devices Meeting in Washington discuss such multiple implantations for the purpose of producing accurately predictable threshold conditions. By another prior proposal, multiple lateral channels are disclosed to provide a double valued gain characteristic.

The above prior art does not consider multiple channel doping with a view to minimizing capacitance, particularly that of the drain whenever biased so as to be surrounded by a depletion layer. Drain diode capacitance slows the speed of operation available in an MOS device. It also adds reactance to a nominal pure resistance in an integrated circuit device. Other prior proposals reduce drain capacitance by providing a relatively low conductivity body and, adjacent the drain region at the surface of the device, a relatively highly doped, higher conductivity region, so that the depletion layer around most of the drain region is wide and thus exhibits low capacitance. This may solve the drain depletion layer capacitance problem in some instances, but it reduces control sensitivity by gate potential, and it leaves the device subject to punch-through breakdown as a result of the high resistivity body material in a significantly large portion of the channel. Another prior attempt to reduce both capacitance and punch-through breakdown problems, employs a relatively high conductivity substrate, at least where it is effective as the channel which reduces sensitivity of control by the gate even more.

The present invention features a pair of spaced high conductivity electrode regions adjacent to a surface of a relatively low conductivity semiconductor body, and, laterally extending therebetween, a very thin channel portion and a relatively deep region of the same type conductivity as that of the substrate but of a higher degree of conductivity than the substrate, the relatively deep region extending in depth further than at least one of the electrode regions (to capacitively shield it) but not extending actually underneath this terminal region (since capacitances may be actually increased thereby). This channel structure may be very satisfactorily produced by well-known ion implantation techniques, giving very controllable depth and lateral extent according to "dosage", i.e., implant energy and fluence.

In the drawing there is shown a cross section through part of an integrated circuit device including, for example, the novel NMOS device.

While the following discussion is concerned largely with the example of an NMOS transistor, the same principles may also be applied to PMOS transistors with suitable adjustments of dopant polarities and concentrations.

Referring to the drawing there is shown a very low conductivity P—substrate 1, e.g. boron doped silicon, having a major surface 2 covered with an insulating oxide layer 3, which may be silicon dioxide formed from the substrate material. Communicating with the major surface 2 are high conductivity electrode regions, namely an N+ source region 4 and an N+ drain region 5, which are preferably produced by in-diffusion of phosphorus or another donor into the substrate 1 in known manner.

The source region 4 and the drain region 5 interface with the bulk of the low conductivity P—substrate 1 forming PN junctions therewith. Laterally, the source and drain are separated by a channel zone comprising a channel portion 6, communicating with the major surface 2 as shown (or lying just beneath it, in a manner equivalent to leaving a thin superficial layer of P—substrate), and a P-type region 7 which extends below the first channel portion 6 to a depth which is not substantially less than the depth of either electrode region 4 or 5. Preferably, the P-type region 7 extends to a depth greater than that of the electrode regions 4 and 5 but should not, however, extend laterally to locations directly below the drain region 5 or source region 4.

The P-type region 7 has moderate conductivity, somewhat higher than that of the substrate 1. Since its extend should be controlled and predictable, to provide electrostatic shielding between the source and drain regions but not to increase capacitance, especially drain/substrate capacitance, the P-type region 7 is preferably produced by ion-implantation.

The channel portion 6 will carry substantially all the current of the MOS device and is very narrow in cross-section (i.e. in the depth dimension) compared with the P-type region 7. The channel portion 6 may be of P type conductivity, higher or lower than that of the P-type region 7, or it may be of N type conductivity, since the invention is applicable to either enhancement or depletion MOS devices.

The dimensions and conductivity value and type being even more important for the channel portion 6 than the P-type region 7, the channel portion 6 is also ion-implanted, either into background substrate material or, if the region 7 has already been produced so as to extend upwards towards or to the surface 2, the channel 6 may be ion-implanted into the region 7.

Directly above the channel portion 6, on the top side of the oxide layer 3 and hence insulated from the channel, is a conventional metallized gate electrode 8 by which field effect control is exerted on the channel current by the application of control biases. The oxide layer is thin enough to permit the field effect in the ion-implanted channel portion 6.

In general, if an MOS channel region is highly doped, gate control is relatively insensitive, so that excessive gate voltages have to be used. Also shunt capacitances, generally unwanted, arise with highly conductive channels, making rapid or high frequency operation very difficult. Moreover, attempts to overcome both of these problems by extending the channel, between more widely spaced source and drain regions, to establish more gate control and to decrease capacitance leads to slower operation. Furthermore, highly doped channels can lead to delays before a nominal cut-off gate voltage actually cuts off an existing channel current, again leading to slower operation. Very low doping of the channel counteracts the above tendency to insensitivity and high capacitance of the reverse biased drain, but the resulting wider depletion layer around the drain can extend to the source and cause "punch-through", an excessive current limited only by space charge effects. Lengthening the channel to avoid punch-through again slows the speed of the device and reduces the component density in integrating multiple MOS devices. Even more important, and also due to surface effects, the surface 2 gives rise to perturbations in channel currents close to it, partly due to the oxide presence creating a contact potential with the semiconductor and partly due to crystal defects, and the current perturbations are greatly increased when the locality is only lightly doped.

Accordingly, the moderately doped under-portion 7 and the somewhat more highly doped but very thin over-portion 6 constitute the novel double-implanted channel zone, and the over-portion 6 is conductive enough for the surface perturbation effects to largely become inappreciable. It is found that the drain-source spacing can become quite small without either "punch-through" breakdown occurring at reasonable voltages or excessive electrostatic interference between the regions 4, 5. Very advantageous is the fact that, by appropriate dimensioning and doping of the two portions 6, 7 of the channel zone, the above advantages are maintained, while also the threshold selections of the prior art can be simultaneously realized. Because the substrate has a very low conductivity, a wide depletion layer forms directly below the drain (where no punch-through danger arises) when the latter is reverse-biased, and drain/substrate capacitance is also very low. The substrate may be made of even lower conductivity below the drain locally for this reason. The downwardly extending P-type region 7 shields the source 4 from capacitive interference from the drain 5, even with small spacings. The ion-implantation of the channel portion 6 should allow for surface effects, since the production of the oxide can alter the final doping and conductivity. The ion-implantations can be through the oxide, or prior to oxidation. The P-type region 7 will never pass current, the channel portion 6 carrying it entirely, whether in enhancement or depletion mode devices.

The optimum doping depth and concentration ranges for such multiple layer structures depends on whether the transistor is an NMOS or PMOS device, the work function of the gate electrode, whether the gate electrode is metal (for example, aluminum) or doped polysilicon, and on the thickness of the gate oxide. Assuming aluminum gate devices, typically a silicon MOS enhancement device may have a substrate 1 doped in the range from about $10^{13}$ to about $10^{15}$ impurity atoms per cc, preferably just below about $10^{14}$ impurity atoms per cc. for a PMOS transistor and just below $10^{15}$ impurity atoms per cc for an NMOS transistor. The lower region 7 (N type for PMOS and P type for NMOS transistors) may have about twenty times as many impurities as the substrate, e.g. typically about $2 \times 10^{15}$ per cc for PMOS and $2 \times 10^{16}$ for NMOS transistors and be of the same conductivity type as the substrate. The upper portion 6 of the channel will be only about 0.3 $\mu$m thick or less, e.g. 0.15 $\mu$m thick, and its doping will be N or P type appropriate to enhancement or depletion mode operation. If the implantation produces a P-type zone, the presence of the oxide makes the zone less P-type, so that this has to be allowed for. When only low conductivity P-type substrate material is present near the surface, as in some konwn MOS types, the top P-layer becomes converted to N-type by the oxide, and a depletion MOS results. The novel device is depletion or enhancement operable, according to the thickness and the dose of the implant.

If especially low capacitance is desired, the P—substrate bulk immediately around by the drain as shown the dashed line region 9 may also be ion-implanted or otherwise locally doped with a small dose of donors which leaves a very low residual P-type conductivity, i.e. less than $10^{13}$ impurities per cc. This may be achieved with an ion-implant dose of $10^{11}$ or $10^{12}$ atoms per $cm^2$ of donors.

Typical ion-implantation doses of the channel portion 6 are 1 to $10 \times 10^{11}$ atoms per $cm^2$ to a depth of 0.25 $\mu$m while the lower implanted P type portion 7 will generally be produced by a dose of 1 to $20 \times 10^{11}$ atoms/$cm^2$ to a depth of 1 to 2 microns. The ranges are chosen with threshold bias conductivity conditions in mind, as well as the main low capacitance, low punch-through aim.

Referring again to the drawing, the drain region may serve as the drain in a further similar MOS device 10 fragmentedly illustrated to the right thereof, having an upper channel portion 11, lower P type portion 12 and a source not shown. Sharing the electrode regions thus between two active devices is well-known in the integrated circuit art.

The invention is not confined to MOS devices, and it is not confined to ion-implanting the portions of the channel zone. These may form a diffused resistance channel between the terminal regions in the substrate in which low capacitance or reactive shunting is imperative.

What is claimed is:

1. In a very low conductivity semiconductor bulk of one type conductivity, the combination of at least two spaced terminal electrode regions of the opposite conductivity type communicating with a defined surface of the bulk, a narrow channel portion, comprising an ion-implantation, extending between the two terminal regions, and a region also extending completely between the two terminal regions, said region being located more remote from the defined surface than the channel portion and having the same conductivity as, but to a substantially greater degree than, the substrate, said region extending to a greater depth from the surface than at least one of said terminal electrode regions, but said region not extending under either of said two spaced terminal electrode regions.

2. The combination of claim 1 further comprising an insulating layer on the surface of the bulk suprajacent the first channel portion, and a gate electrode applied also suprajacent thereto and on said insulating layer.

3. The combination of claim 2 wherein the channel portion has the same conductivity type as the substrate.

4. The combination of claim 3 wherein the channel portion has P-conductivity, the terminals being of N+ type, said channel portion resulting however from an implantation of N— inducing ions.

5. The combination of claim 1 wherein said channel portion is substantially more conductive than said region.

6. An insulated gate silicon MOS device comprising
- a very low conductivity substrate of one conductivity type and having a major surface;
- a current carrier channel portion at the major surface;
- a region of said one conductivity type located below the current carrier channel portion;
- a first terminal region of the opposite conductivity type contacting one end of each of said current carrier channel portion and said region and communicating with said major surface;
- a second terminal region of said opposite conductivity type, communicating with said major surface and contacting the other end of each of said current carrier channel portion and said region,
- an insulating oxide layer on the major surface covering at least an area of the current carrying channel portion but leaving uncovered at least an area of the first and second terminal regions;
- respective metallizings on the insulating oxide and on uncovered areas of the terminal regions to provide electrical access to the device;
- said region of said one conductivity type extending deeper than, but not directly underneath, either of said terminal regions.

7. A device according to claim 6, being an enhancement N-MOS transistor.

8. A device according to claim 7 wherein both said current carrying channel portion and said region are ion-implants.

* * * * *

UNITED STATES PATENT AND TRADEMARK OFFICE
CERTIFICATE OF CORRECTION

PATENT NO. : 4,132,998

DATED : January 2, 1979

INVENTOR(S) : Andrew Gordon Francis Dingwall

It is certified that error appears in the above-identified patent and that said Letters Patent is hereby corrected as shown below:

In the Abstract:
Line 4, "P-substrate" should be "P-- substrate".

Column 1, line 11, delete ",".

"P—substrate" should be "P-- substrate" in each of the following places:
Column 2, lines 10, 20 and 25.

"P-type" should be "P- type" in each of the following places:
Column 2, lines 26, 29, 33, 38, 44, and 50; Column 3, lines 42 and 48; Column 4, lines 4, 5, 7, and 18.

Column 3, line 1, delete ",".

Column 4, line 8, "P-layer" should be "P- layer".

Column 4, line 9, "N-type" should be "N- type".

Column 4, line 13, "P—sub-" should be "P- sub-".

Column 4, line 66, "P-conductivity" should be "P- conductivity".

Signed and Sealed this

Third Day of July 1979

[SEAL]

Attest:

LUTRELLE F. PARKER

*Attesting Officer*    *Acting Commissioner of Patents and Trademarks*